(12) United States Patent
Qian et al.

(10) Patent No.: US 9,630,293 B2
(45) Date of Patent: Apr. 25, 2017

(54) CHEMICAL MECHANICAL POLISHING PAD COMPOSITE POLISHING LAYER FORMULATION

(71) Applicants: Rohm and Haas Electronic Materials CMP Holdings, Inc., Newark, DE (US); Dow Global Technologies LLC, Midland, MI (US)

(72) Inventors: Bainian Qian, Newark, DE (US); Julia Kozhukh, Bear, DE (US); Teresa Brugarolas Brufau, Philadelphia, PA (US); Diego Lugo, Newark, DE (US); George C. Jacob, Newark, DE (US); Jeffrey B. Miller, West Chester, PA (US); Tony Quan Tran, Bear, DE (US); Marc R. Stack, Middletown, DE (US); Jeffrey James Hendron, Elkton, MD (US)

(73) Assignees: Rohm and Haas Electronic Materials CMP Holdings, Inc., Newark, DE (US); Dow Global Technologies LLC, Midland, MI (US)

( * ) Notice: Subject to any disclaimer, the term of this patent is extended or adjusted under 35 U.S.C. 154(b) by 0 days.

(21) Appl. No.: 14/751,385

(22) Filed: Jun. 26, 2015

(65) Prior Publication Data
US 2016/0375545 A1    Dec. 29, 2016

(51) Int. Cl.
*B24B 37/26* (2012.01)
*B24B 37/22* (2012.01)
(Continued)

(52) U.S. Cl.
CPC ............... *B24B 37/26* (2013.01); *B24B 1/00* (2013.01); *B24B 37/044* (2013.01); *B24B 37/22* (2013.01);
(Continued)

(58) Field of Classification Search
None
See application file for complete search history.

(56) References Cited

U.S. PATENT DOCUMENTS

| | | | |
|---|---|---|---|
| 4,500,656 A | 2/1985 | Rasshofer et al. | |
| 5,789,451 A | 8/1998 | Guidetti et al. | |
| 5,859,285 A | 1/1999 | Guidetti et al. | |
| 7,169,030 B1 | 1/2007 | Kulp | |
| 7,445,847 B2 | 11/2008 | Kulp | |
| 8,288,448 B2 | 10/2012 | Kulp | |
| 2008/0139684 A1* | 6/2008 | Swisher | B24B 37/24 521/155 |
| 2009/0094900 A1 | 4/2009 | Swisher et al. | |
| 2010/0317261 A1* | 12/2010 | Kulp | B24B 37/205 451/41 |

(Continued)

OTHER PUBLICATIONS

Copending U.S. Appl. No. 14/751,340.
(Continued)

*Primary Examiner* — Jiong-Ping Lu
(74) *Attorney, Agent, or Firm* — Thomas S. Deibert; Andrew Merriam

(57) ABSTRACT

A chemical mechanical polishing pad is provided containing: a polishing layer having a polishing surface; wherein the polishing layer comprises a first continuous non-fugitive polymeric phase and a second non-fugitive polymeric phase; wherein the first continuous non-fugitive polymeric phase has a plurality of periodic recesses; wherein the plurality of periodic recesses are occupied with the second non-fugitive polymeric phase; wherein the first continuous non-fugitive polymeric phase has an open cell porosity of ≤6 vol %; wherein the second non-fugitive polymeric phase contains an open cell porosity of ≥10 vol %; and, wherein the polishing surface is adapted for polishing a substrate.

11 Claims, 15 Drawing Sheets

(51) Int. Cl.
*B24B 37/24* (2012.01)
*B24B 53/017* (2012.01)
*H01L 21/306* (2006.01)
*B24B 1/00* (2006.01)
*B24B 37/04* (2012.01)
*B29C 70/66* (2006.01)
*G02B 1/12* (2006.01)
*H01F 41/00* (2006.01)
*H01L 21/321* (2006.01)

(52) U.S. Cl.
CPC ............ *B24B 37/24* (2013.01); *B24B 53/017* (2013.01); *B29C 70/66* (2013.01); *G02B 1/12* (2013.01); *H01F 41/00* (2013.01); *H01L 21/30625* (2013.01); *H01L 21/3212* (2013.01)

(56) References Cited

U.S. PATENT DOCUMENTS

2016/0089764 A1* 3/2016 Feng ................ B24B 37/26
                                                      51/297

OTHER PUBLICATIONS

Copending U.S. Appl. No. 14/751,350.
Copending U.S. Appl. No. 14/751,364.
Copending U.S. Appl. No. 14/751,410.
Copending U.S. Appl. No. 14/751,423.
Copending U.S. Appl. No. 14/751,328.

* cited by examiner

CHEMICAL MECHANICAL POLISHING PAD COMPOSITE POLISHING LAYER FORMULATION

The present invention relates to a chemical mechanical polishing pad. More particularly, the present invention relates to a chemical mechanical polishing pad containing a polishing layer having a polishing surface; wherein the polishing layer comprises a first continuous non-fugitive polymeric phase and a second non-fugitive polymeric phase; wherein the first continuous non-fugitive polymeric phase has a plurality of periodic recesses; wherein the plurality of periodic recesses are occupied with the second non-fugitive polymeric phase; wherein the first continuous non-fugitive polymeric phase has an open cell porosity of ≤6 vol %; wherein the second non-fugitive polymeric phase contains an open cell porosity of ≥10 vol %; and, wherein the polishing surface is adapted for polishing a substrate.

In the fabrication of integrated circuits and other electronic devices, multiple layers of conducting, semiconducting and dielectric materials are deposited onto and removed from a surface of a semiconductor wafer. Thin layers of conducting, semiconducting and dielectric materials may be deposited using a number of deposition techniques. Common deposition techniques in modern wafer processing include physical vapor deposition (PVD), also known as sputtering, chemical vapor deposition (CVD), plasma-enhanced chemical vapor deposition (PECVD) and electrochemical plating, among others. Common removal techniques include wet and dry isotropic and anisotropic etching, among others.

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful for removing undesired surface topography and surface defects, such as rough surfaces, agglomerated materials, crystal lattice damage, scratches and contaminated layers or materials.

Chemical mechanical planarization, or chemical mechanical polishing (CMP), is a common technique used to planarize or polish work pieces such as semiconductor wafers. In conventional CMP, a wafer carrier, or polishing head, is mounted on a carrier assembly. The polishing head holds the wafer and positions the wafer in contact with a polishing layer of a polishing pad that is mounted on a table or platen within a CMP apparatus. The carrier assembly provides a controllable pressure between the wafer and polishing pad. Simultaneously, a polishing medium (e.g., slurry) is dispensed onto the polishing pad and is drawn into the gap between the wafer and polishing layer. To effect polishing, the polishing pad and wafer typically rotate relative to one another. As the polishing pad rotates beneath the wafer, the wafer sweeps out a typically annular polishing track, or polishing region, wherein the wafer's surface directly confronts the polishing layer. The wafer surface is polished and made planar by chemical and mechanical action of the polishing layer and polishing medium on the surface.

James et al. disclose the importance of grooving in the polishing surface of chemical mechanical polishing pads in U.S. Pat. No. 6,736,709. Specifically, James et al. teach that the "Groove Stiffness Quotient" ("GSQ") estimates the effects of grooving on pad stiffness and the "Groove Flow Quotient" ("GFQ") estimates the effects of grooving on (pad interface) fluid flow; and that there is a delicate balance between the GSQ and GFQ in selecting an ideal polishing surface for a given polishing process.

Notwithstanding, as wafer dimension continue to shrink the demands of the associated polishing processes are becoming evermore intense.

Accordingly, there is a continuing need for polishing layer designs that expand the operating performance range of chemical mechanical polishing pads.

The present invention provides a chemical mechanical polishing pad, comprising: a polishing layer having a polishing surface, a base surface and an average thickness, $T_{P\text{-}avg}$, measured normal to the polishing surface from the base surface to the polishing surface; wherein the polishing layer comprises a first continuous non-fugitive polymeric phase and a second non-fugitive polymeric phase; wherein the first continuous non-fugitive polymeric phase has a plurality of periodic recesses having an average recess depth, $D_{avg}$, from the polishing surface measured normal to the polishing surface from the polishing surface toward the base surface; wherein the average recess depth, $D_{avg}$, is less than the average thickness, $T_{P\text{-}avg}$; wherein the plurality of periodic recesses are occupied with the second non-fugitive polymeric phase; wherein the first continuous non-fugitive polymeric phase is a reaction product of a first continuous phase isocyanate-terminated urethane prepolymer having 8 to 12 wt % unreacted NCO groups and a first continuous phase curative; wherein the second non-fugitive polymeric phase is selected from a second continuous non-fugitive polymeric phase and a second discontinuous non-fugitive polymeric phase; wherein the second non-fugitive polymeric phase is formed by combining a poly side (P) liquid component and an iso side (I) liquid component; wherein the poly side (P) liquid component comprises at least one of a (P) side polyol, a (P) side polyamine and a (P) side alcohol amine; wherein the iso side (I) liquid component, comprising at least one (I) side polyfunctional isocyanate; wherein the first continuous non-fugitive polymeric phase has an open cell porosity of ≤6 vol %; wherein the second non-fugitive polymeric phase contains an open cell porosity of ≥10 vol %; and, wherein the polishing surface is adapted for polishing a substrate.

The present invention provides a method of polishing a substrate, comprising: providing a substrate selected from at least one of a magnetic substrate, an optical substrate and a semiconductor substrate; providing a chemical mechanical polishing pad according to the present invention; creating dynamic contact between the polishing surface of the polishing layer and the substrate to polish a surface of the substrate; and, conditioning of the polishing surface with an abrasive conditioner.

DETAILED DESCRIPTION

Historically, the GSQ and GFQ values for a polishing surface of a given polishing layer provided a workable range within which to design effective polishing layers. Surprisingly, the present invention provides a means for breaking the mold of heretofore established GSQ and GFQ parameters for polishing layers by decoupling the polishing layer stiffness and slurry distribution performance of polishing layer designs; thereby expanding the range of polishing layer designs to heretofore unobtainable balances of polishing performance properties.

The term "non-fugitive" as used herein and in the appended claims in reference to a polymeric phase means that the polymeric phase (e.g., the second continuous non-fugitive polymeric phase) does not melt, dissolve, disintegrate or otherwise deplete selectively relative to another polymer phase (e.g., the first continuous non-fugitive polymeric phase) present in the polishing layer.

Figure 7:
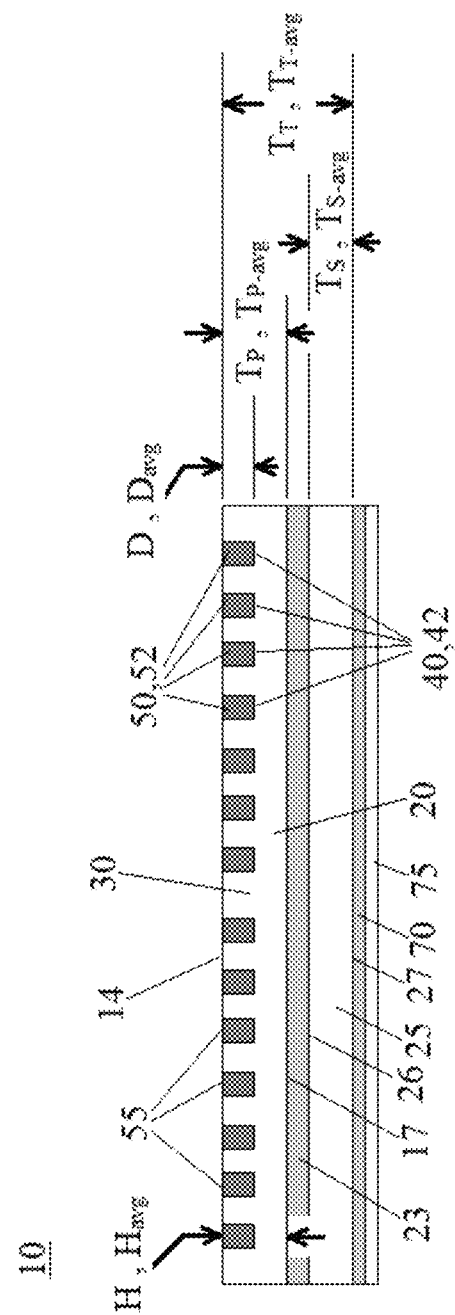
FIG. 7 is a depiction of a cross sectional view of a chemical mechanical polishing pad of the present invention taken along line B-B in FIG. 6.
Figure 8:
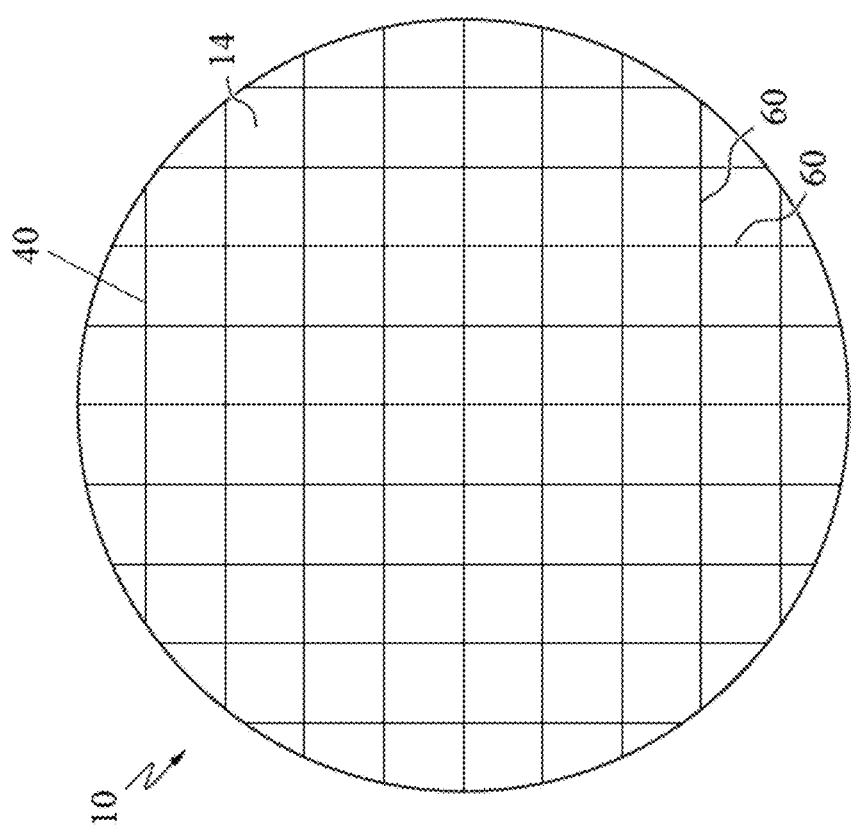
FIG. 8 is a depiction of a top plan view of a chemical mechanical polishing pad of the present invention.
Figure 9:
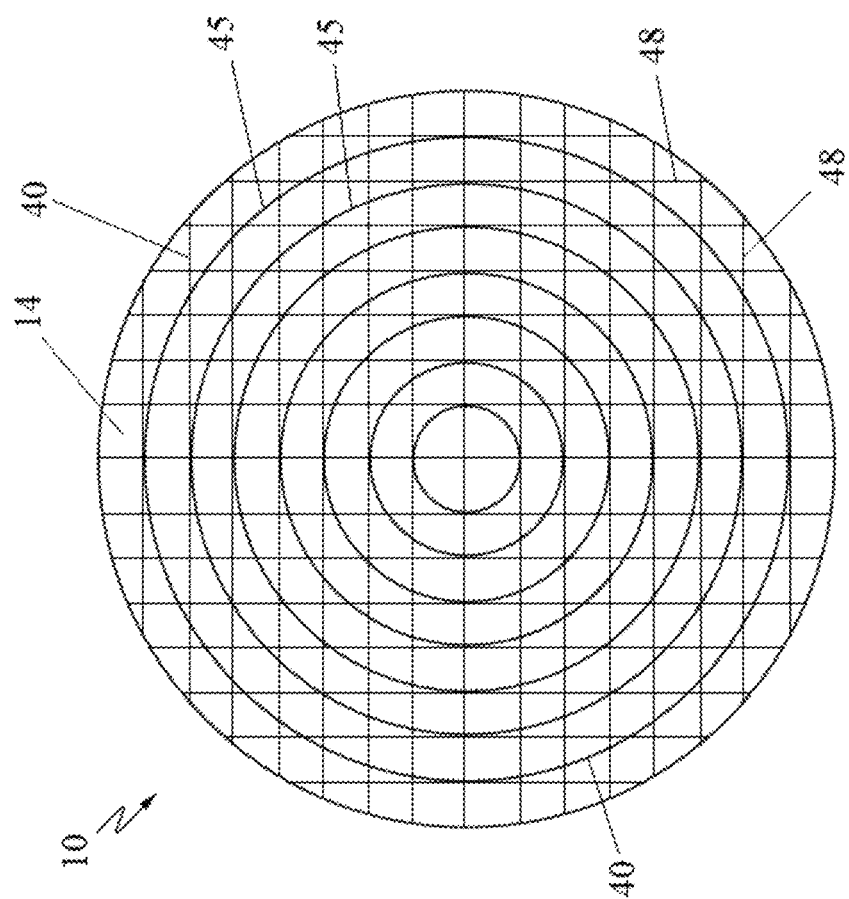
FIG. 9 is a depiction of a top plan view of a chemical mechanical polishing pad of the present invention.
Figure 10:
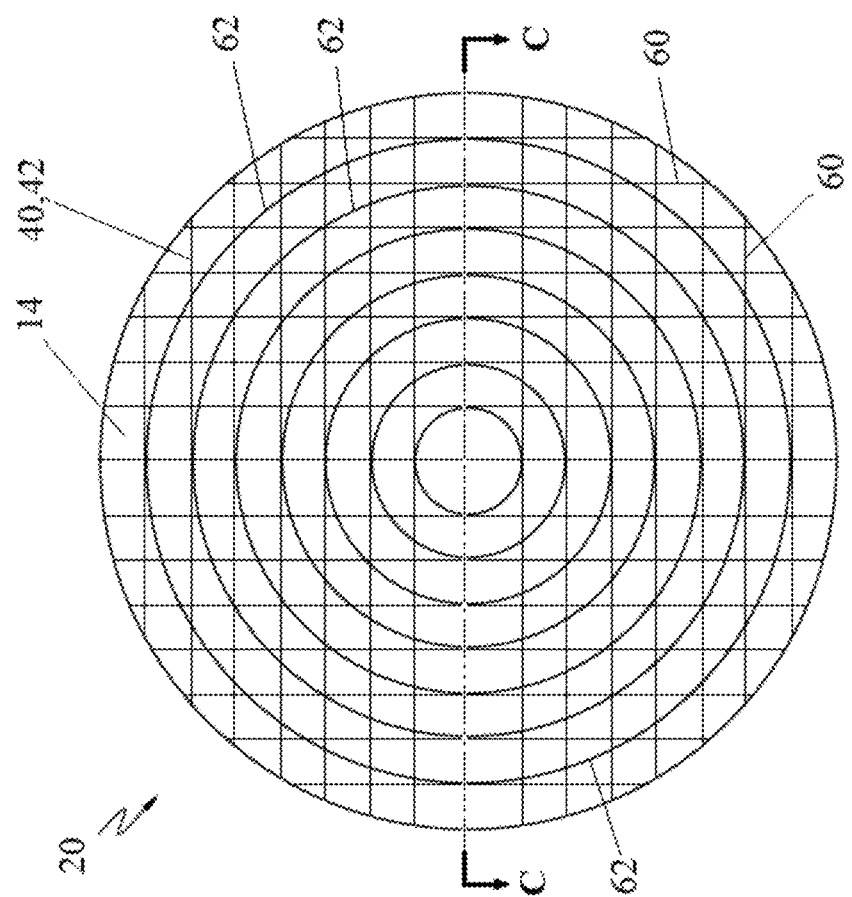
FIG. 10 is a depiction of a top plan view of a polishing layer of the present invention.
Figure 11:
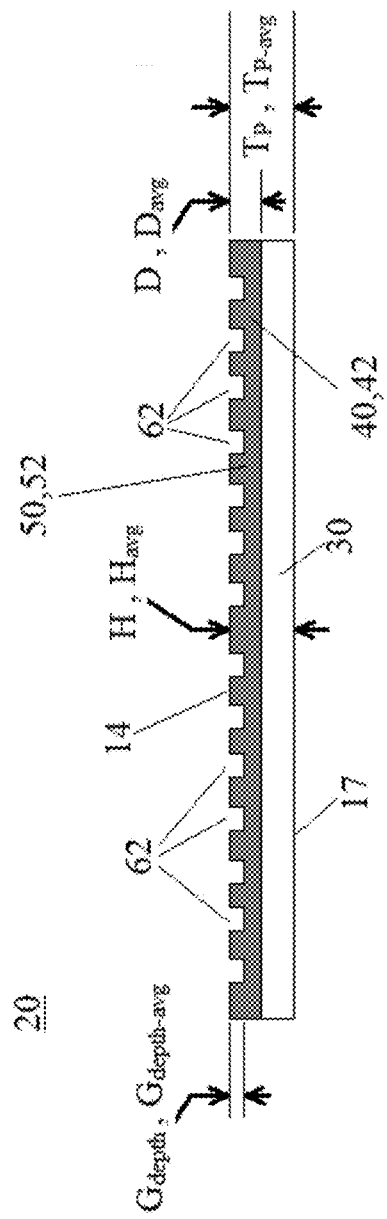
FIG. 11 is a depiction of a cross sectional view of a polishing layer of the present invention taken along line C-C in FIG. 10.
Figure 12:
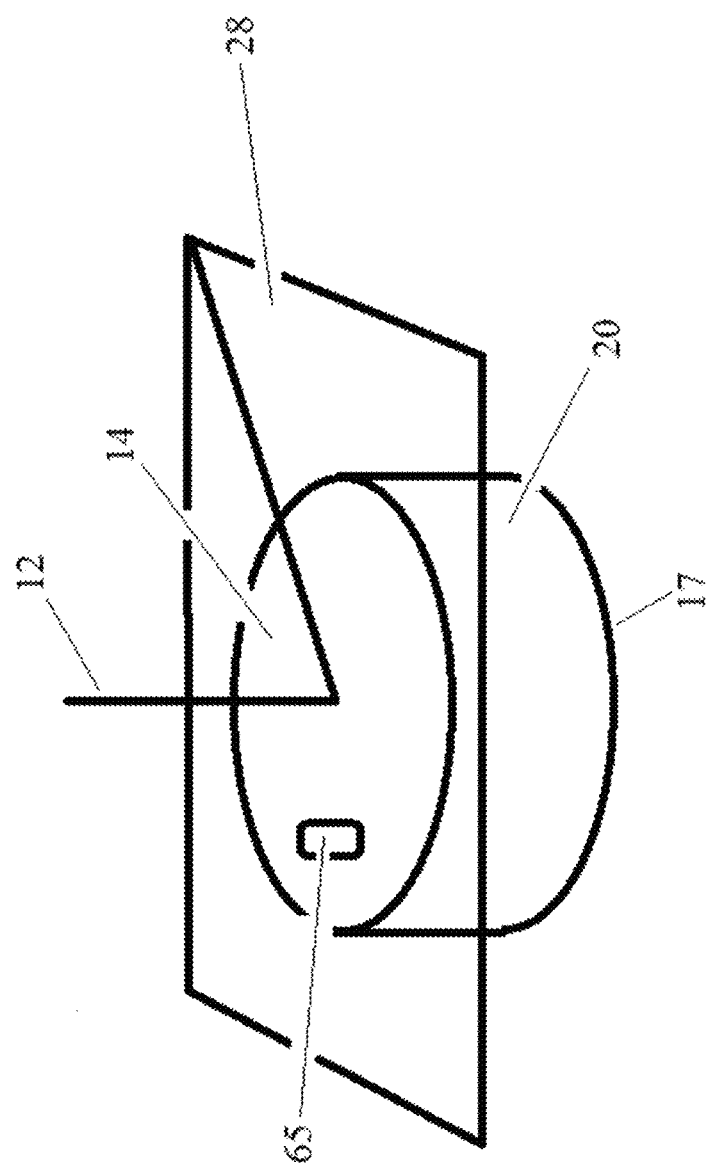
FIG. 12 is a depiction of a perspective view of a polishing layer of the present invention with a window.
Figure 13:
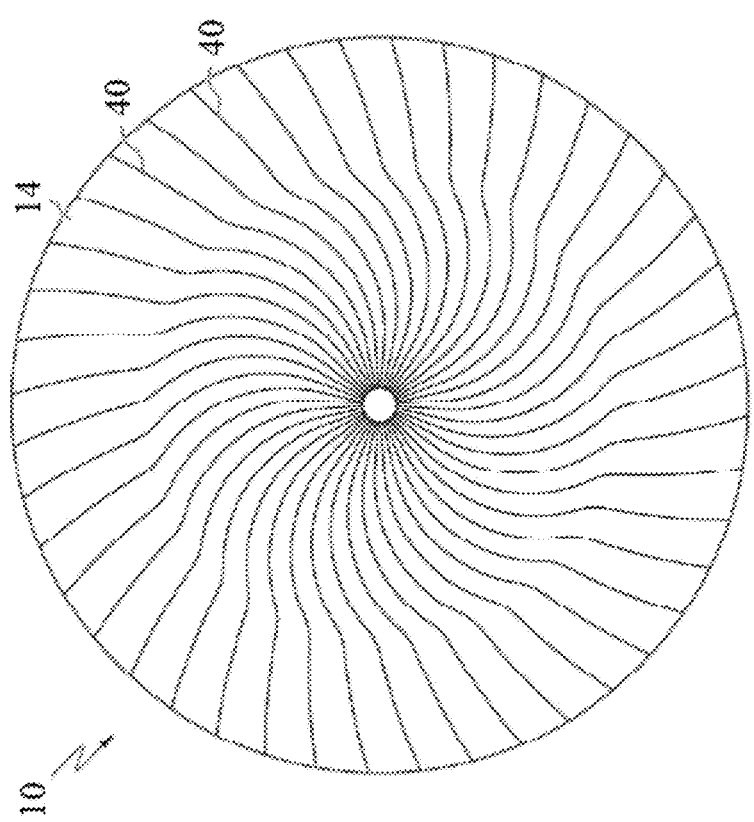
FIG. 13 is a depiction of a top plan view of a chemical mechanical polishing pad of the present invention.
Figure 14:
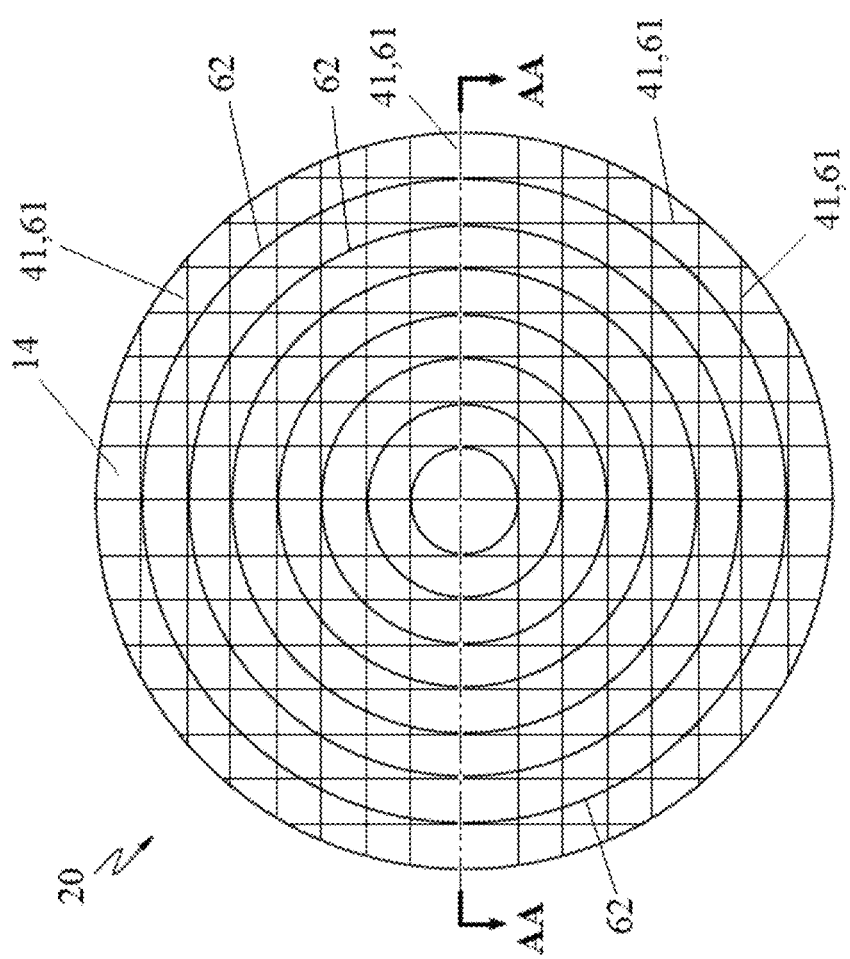
FIG. 14 is a depiction of a top plan view of a polishing layer of the present invention.

The term "average total thickness, $T_{T\text{-}avg}$" as used herein and in the appended claims in reference to a chemical mechanical polishing pad (10) having a polishing surface (14) means the average thickness, $T_T$, of the chemical mechanical polishing pad measured normal to the polishing surface (14) from the polishing surface (14) to the bottom surface (27) of the subpad (25). (See FIGS. 3 and 7).

Figure 1:
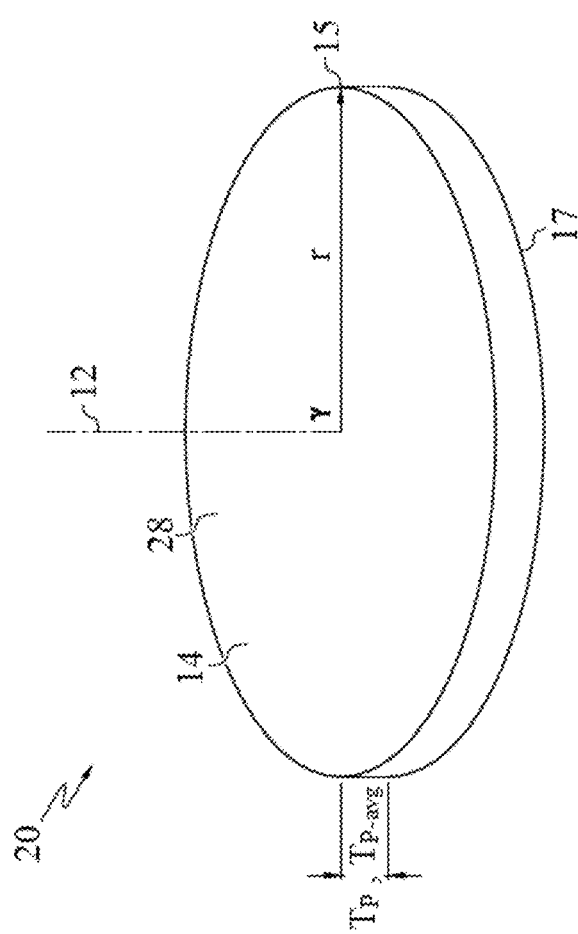
FIG. 1 is a depiction of a perspective view of a polishing layer of the present invention.
Figure 2:
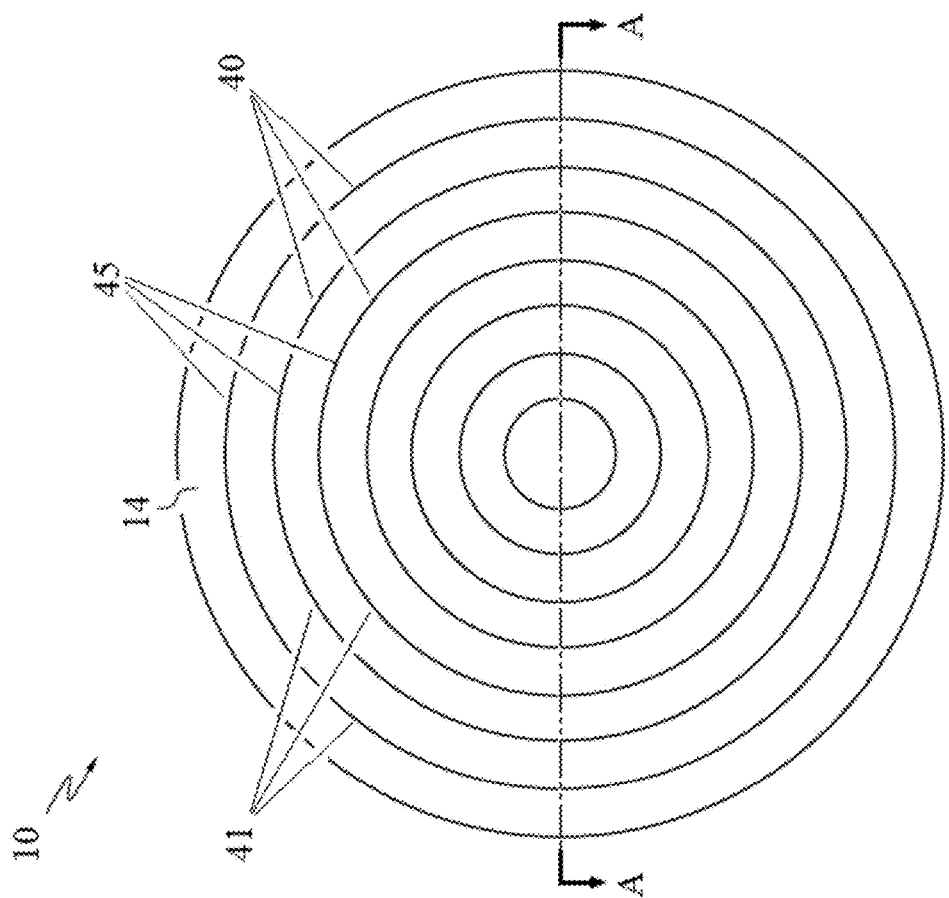
FIG. 2 is a depiction of a top plan view of a chemical mechanical polishing pad of the present invention.

The term "substantially circular cross section" as used herein and in the appended claims in reference to a polishing layer (20) means that the longest radius, r, of the cross section from the central axis (12) to the outer perimeter (15) of the polishing surface (14) of the polishing layer (20) is ≤20% longer than the shortest radius, r, of the cross section from the central axis (12) to the outer perimeter (15) of the polishing surface (14). (See FIG. 1).

The chemical mechanical polishing pad (10) of the present invention is preferably adapted for rotation about a central axis (12). (See FIG. 1). Preferably, the polishing surface (14) of polishing layer (20) is in a plane (28) perpendicular to the central axis (12). The chemical mechanical polishing pad (10) is optionally adapted for rotation in a plane (28) that is at an angle, γ, of 85 to 95° to the central axis (12), preferably, of 90° to the central axis (12). Preferably, the polishing layer (20) has a polishing surface (14) that has a substantially circular cross section perpendicular to the central axis (12). Preferably, the radius, r, of the cross section of the polishing surface (14) perpendicular to the central axis (12) varies by ≤20% for the cross section, more preferably by ≤10% for the cross section.

The term "polishing medium" as used herein and in the appended claims encompasses particle containing polishing solutions and nonparticle containing polishing solutions, such as abrasive free and reactive liquid polishing solutions.

The term "chemical bond" as used herein and in the appended claims refers to attractive forces between atoms and encompasses covalent bonds, ionic bonds, metallic bonds, hydrogen bonds and van der Walls forces.

The term "poly(urethane)" as used herein and in the appended claims encompasses (a) polyurethanes formed from the reaction of (i) isocyanates and (ii) polyols (including diols); and, (b) poly(urethane) formed from the reaction of (i) isocyanates with (ii) polyols (including diols) and (iii) water, amines (including diamines and polyamines) or a combination of water and amines (including diamines and polyamines).

Preferably, the chemical mechanical polishing pad (10) of the present invention is specifically designed to facilitate the polishing of a substrate selected from at least one of a magnetic substrate, an optical substrate and a semiconductor substrate. More preferably, the chemical mechanical polishing pad (10) of the present invention is specifically designed to facilitate the polishing of a semiconductor substrate. Most preferably, the chemical mechanical polishing pad (10) of the present invention is specifically designed to facilitate the polishing of a semiconductor substrate, wherein the semiconductor substrate is a semiconductor wafer.

Preferably, the chemical mechanical polishing pad (10) of the present invention, comprises: a polishing layer (20) having a polishing surface (14), a base surface (17) and an average thickness, $T_{P\text{-}avg}$, measured normal to the polishing surface (14) from the base surface (17) to the polishing surface (14); wherein the polishing layer (20) comprises a first continuous non-fugitive polymeric phase (30) and a second non-fugitive polymeric phase (50); wherein the first continuous non-fugitive polymeric phase (30) has a plurality of periodic recesses (40) having an average recess depth, $D_{avg}$, from the polishing surface (14) measured normal to the polishing surface (14) from the polishing surface (14) toward the base surface (17); wherein the average recess depth, $D_{avg}$, is less than the average thickness, $T_{P\text{-}avg}$ (preferably, wherein $D_{avg} \leq 0.5*T_{P\text{-}avg}$; more preferably, wherein $D_{avg} \leq 0.4*T_{P\text{-}avg}$; most preferably, wherein $D_{avg} \leq 0.375*T_{P\text{-}avg}$); wherein the plurality of periodic recesses (40) are occupied with the second non-fugitive polymeric phase (50); wherein the first continuous non-fugitive polymeric phase (30) is a reaction product of a first continuous phase isocyanate-terminated urethane prepolymer having 8 to 12 wt % unreacted NCO groups and a first continuous phase curative; wherein the second non-fugitive polymeric phase (50) is selected from a second continuous non-fugitive polymeric phase and a second discontinuous non-fugitive polymeric phase; wherein the second non-fugitive polymeric phase (50) is formed by combining a poly side (P) liquid component and an iso side (I) liquid component; wherein the poly side (P) liquid component comprises at least one of a (P) side polyol, a (P) side polyamine and a (P) side alcohol amine; wherein the iso side (I) liquid component, comprising at least one (I) side polyfunctional isocyanate; optionally, wherein the first continuous non-fugitive polymeric phase (30) contains a plurality of hollow core polymeric materials; wherein the plurality of hollow core polymeric materials is incorporated in the first continuous non-fugitive polymeric phase (30) at 0 to 58 vol %;

wherein the first continuous non-fugitive polymeric phase (30) has an open cell porosity of ≤6 vol % (preferably, ≤5 vol %; more preferably, ≤4 vol %; most preferably, ≤3 vol %); wherein the second non-fugitive polymeric phase (50) contains an open cell porosity of ≥10 vol % (preferably, of 25 to 75 vol %; more preferably, 30 to 60 vol %; most preferably, 45 to 55 vol %); and, wherein the polishing surface is adapted for polishing a substrate. (See FIGS. 1-15).

Preferably, the first continuous non-fugitive polymeric phase (30) in the polishing layer (20) of the chemical mechanical polishing pad (10) of the present invention comprises a reaction product of a first continuous phase isocyanate-terminated urethane prepolymer having 8 to 12 wt % unreated NCO groups and a first continuous phase curative. More preferably, the first continuous non-fugitive polymeric phase (30) in the polishing layer (20) of the chemical mechanical polishing pad (10) of the present invention comprises a reaction product of a first continuous phase isocyanate-terminated urethane prepolymer having 8.75 to 12 wt % unreated NCO groups and a first continuous phase curative. More preferably, the first continuous non-fugitive polymeric phase (30) in the polishing layer (20) of the chemical mechanical polishing pad (10) of the present invention comprises a reaction product of a first continuous phase isocyanate-terminated urethane prepolymer having 9.0 to 9.25 wt % unreated NCO groups and a first continuous phase curative.

Preferably, the first continuous non-fugitive polymeric phase (30) in the polishing layer (20) of the chemical mechanical polishing pad (10) of the present invention is the reaction product of a first continuous phase isocyanate-terminated urethane prepolymer having 8 to 12 wt % unreated NCO groups and a first continuous phase curative; wherein the first continuous phase isocyanate-terminated urethane prepolymer is derived from the interaction of a first continuous phase polyisocyanate (preferably, a diisocyanate) with a first continuous phase polyol; wherein the first continuous phase polyol is selected from the group consisting of diols, polyols, polyol diols, copolymers thereof and mixtures thereof. Preferably, the first continuous phase polyol is selected from the group consisting of a polytetramethylene ether glycol (PTMEG); a blend of PTMEG with polypropylene glycol (PPG); and, mixtures thereof with low molecular weight diols (e.g., 1,2-butanediol; 1,3-butanediol; 1,4-butanediol).

Preferably, the first continuous non-fugitive polymeric phase (30) in the polishing layer (20) of the chemical mechanical polishing pad (10) of the present invention is the reaction product of a first continuous phase isocyanate-terminated urethane prepolymer having 8 to 12 wt % unreated NCO groups and a first continuous phase curative; wherein the first continuous phase curative is a first continuous phase polyamine. Preferably, the first continuous phase polyamine is an aromatic polyamine. More preferably, the first continuous phase polyamine is an aromatic polyamine selected from the group consisting of 4,4'-methylene-bis-o-chloroaniline (MbOCA), 4,4'-methylene-bis-(3-chloro-2,6-diethylaniline) (MCDEA); dimethylthiotoluenediamine; trimethyleneglycol di-p-aminobenzoate; polytetramethyleneoxide di-p-aminobenzoate; polytetramethyleneoxide mono-p-aminobenaoate; polypropyleneoxide di-p-aminobenzoate; polypropyleneoxide mono-p-aminobenzoate; 1,2-bis(2-aminophenylthio)ethane; 4,4'-methylene-bis-aniline; diethyltoluenediamine; 5-tert-butyl-2,4-toluenediamine; 3-tert-butyl-2,6-toluenediamine; 5-tert-amyl-2,4-toluenediamine; 3-tert-amyl-2,6-toluenediamine; 5-tert-amyl-2,4-chlorotoluenediamine; and 3-tert-amyl-2,6-chlorotoluenediamine. Most preferably, the first continuous phase polyamine is 4,4'-methylene-bis-o-chloroaniline (MbOCA).

Examples of commercially available PTMEG based isocyanate terminated urethane prepolymers include Imuthane® prepolymers (available from COIM USA, Inc., such as, PET-80A, PET-85A, PET-90A, PET-93A, PET-95A, PET-60D, PET-70D, PET-75D); Adiprene® prepolymers (available from Chemtura, such as, LF 800A, LF 900A, LF 910A, LF 930A, LF 931A, LF 939A, LF 950A, LF 952A, LF 600D, LF 601D, LF 650D, LF 667, LF 700D, LF750D, LF751D, LF752D, LF753D and L325); Andur® prepolymers (available from Anderson Development Company, such as, 70APLF, 80APLF, 85APLF, 90APLF, 95APLF, 60DPLF, 70APLF, 75APLF).

Preferably, the a first continuous phase isocyanate terminated urethane prepolymer used in the method of the present invention is a low free isocyanate terminated urethane prepolymer having less than 0.1 wt % free toluene diisocyanate (TDI) monomer content.

Preferably, the first continuous non-fugitive polymeric phase (30) in the polishing layer (20) of the chemical mechanical polishing pad (10) of the present invention can be provided in both porous and nonporous (i.e., unfilled) configurations. Preferably, the first continuous non-fugitive polymeric phase (30) in the polishing layer (20) of the chemical mechanical polishing pad (10) of the present invention has a specific gravity of ≥0.5 as measured according to ASTM D1622. More preferably, the first continuous non-fugitive polymeric phase (30) in the polishing layer (20) of the chemical mechanical polishing pad (10) of the present invention has a specific gravity of 0.5 to 1.2 (still more preferably, 0.55 to 1.1; most preferably 0.6 to 0.95) as measured according to ASTM D1622.

Preferably, the first continuous non-fugitive polymeric phase (30) in the polishing layer (20) of the chemical mechanical polishing pad (10) of the present invention has a Shore D hardness of 40 to 90 as measured according to ASTM D2240. More preferably, the first continuous non-fugitive polymeric phase (30) in the polishing layer (20) of the chemical mechanical polishing pad (10) of the present invention has a Shore D hardness of 50 to 75 as measured according to ASTM D2240. Most preferably, the first continuous non-fugitive polymeric phase (30) in the polishing layer (20) of the chemical mechanical polishing pad (10) has a Shore D hardness of 55 to 70 as measured according to ASTM D2240.

Preferably, the first continuous non-fugitive polymeric phase (30) in the polishing layer (20) of the chemical mechanical polishing pad (10) is porous. Preferably, the first continuous non-fugitive polymeric phase comprises a plurality of microelements. Preferably, the plurality of microelements are uniformly dispersed throughout the first continuous non-fugitive polymeric phase (30) in the polishing layer (20) of the chemical mechanical polishing pad (10). Preferably, the plurality of microelements is selected from entrapped gas bubbles, hollow core polymeric materials, liquid filled hollow core polymeric materials, water soluble materials and an insoluble phase material (e.g., mineral oil). More preferably, the plurality of microelements is selected from entrapped gas bubbles and hollow core polymeric materials uniformly distributed throughout the first continuous non-fugitive polymeric phase (30). Preferably, the plurality of microelements has a weight average diameter of less than 150 μm (more preferably of less than 50 μm; most preferably of 10 to 50 μm). Preferably, the plurality of microelements comprise polymeric microballoons with shell walls of either polyacrylonitrile or a polyacrylonitrile copolymer (e.g., Expancel® from Akzo Nobel). Preferably, the plurality of microelements are incorporated into the first continuous non-fugitive polymeric phase (30) in the polishing layer (20) of the chemical mechanical polishing pad (10) at 0 to 58 vol % porosity (more preferably, 1 to 58 vol %; most preferably, 10 to 35 vol % porosity). Preferably, the first continuous non-fugitive polymeric phase (30) in the polishing layer (20) of the chemical mechanical polishing pad (10) has an open cell porosity of ≤6 vol % (more preferably, ≤5 vol %; still more preferably, ≤4 vol %; most preferably, ≤3 vol %).

Figure 3:
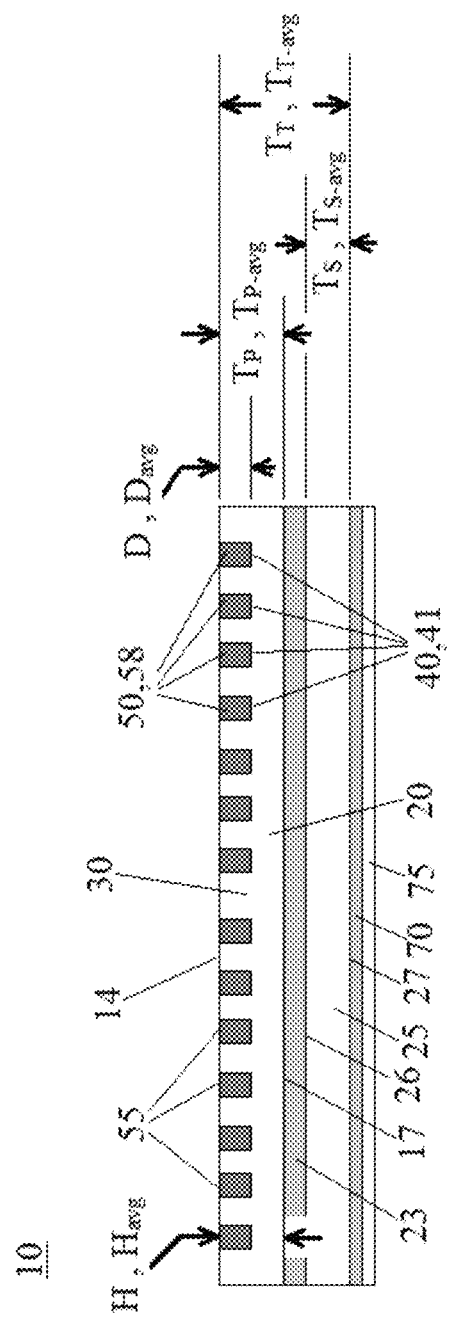
FIG. 3 is a depiction of a cross sectional view of a chemical mechanical polishing pad of the present invention taken along line A-A in FIG. 2.
Figure 4:
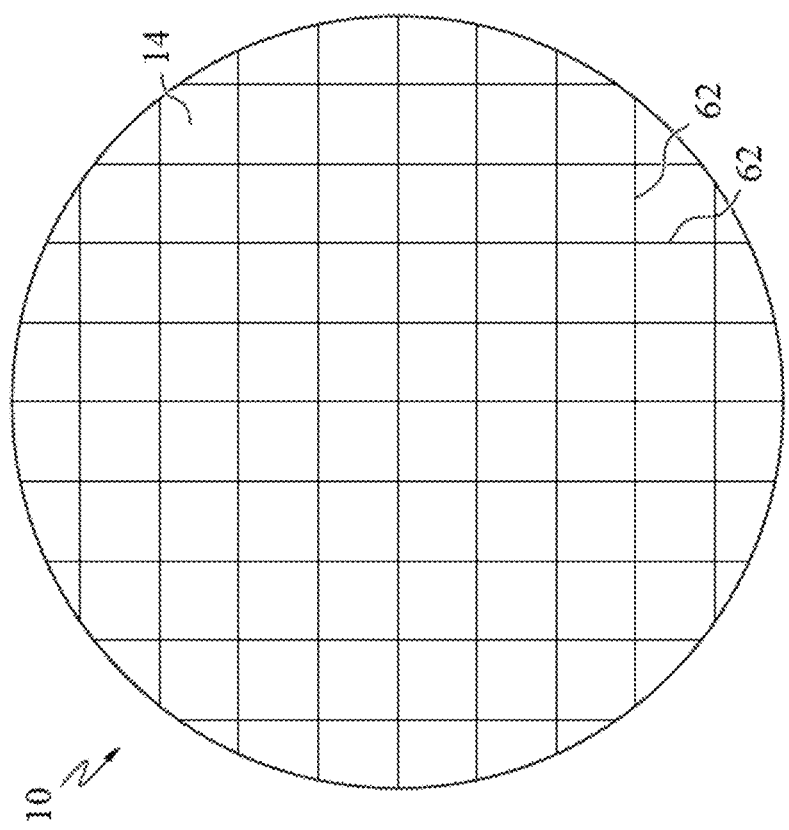
FIG. 4 is a depiction of a top plan view of a chemical mechanical polishing pad of the present invention.
Figure 5:
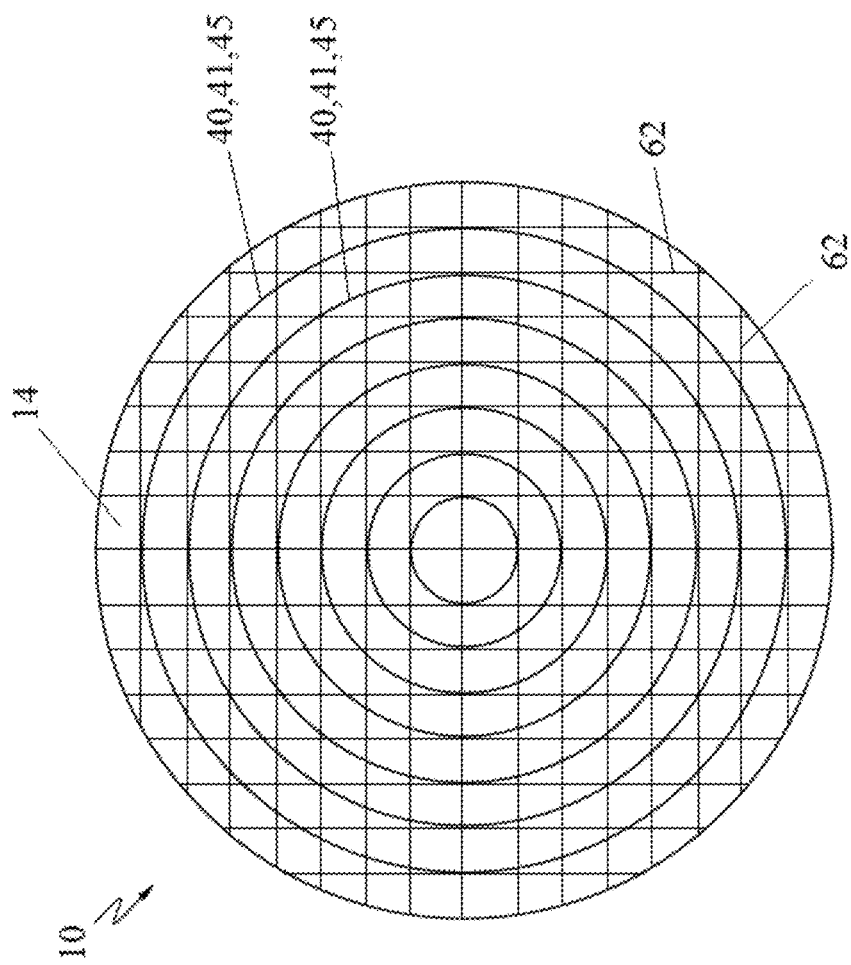
FIG. 5 is a depiction of a top plan view of a chemical mechanical polishing pad of the present invention.
Figure 6:
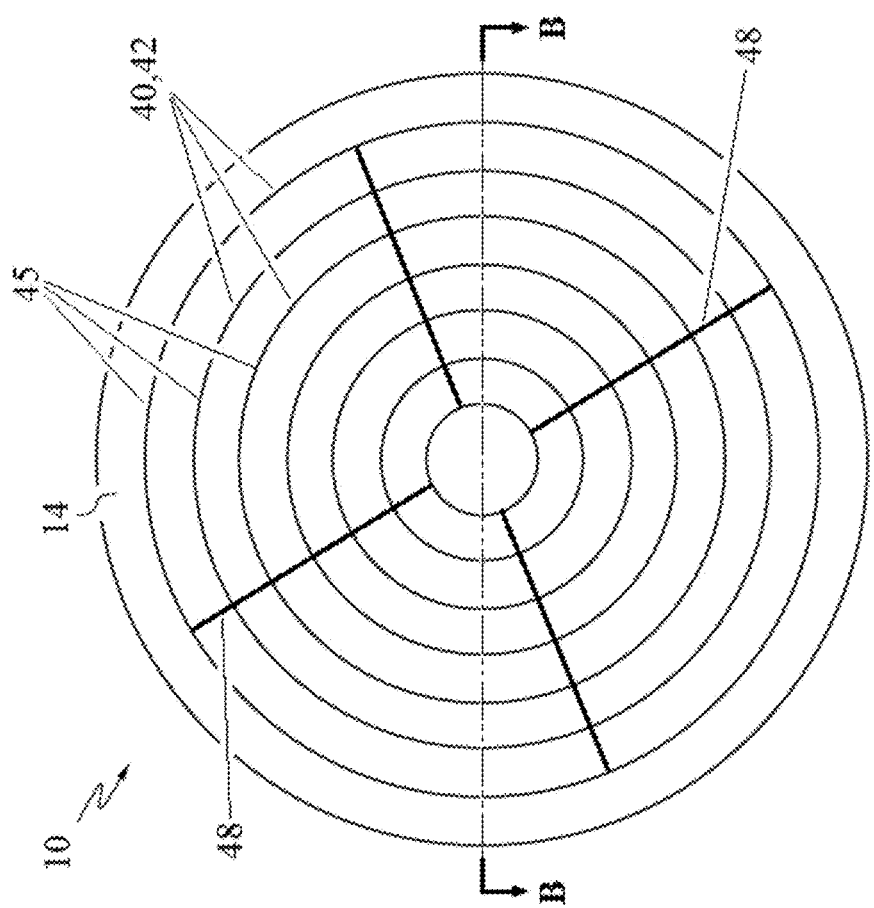
FIG. 6 is a depiction of a top plan view of a chemical mechanical polishing pad of the present invention.
Figure 15:
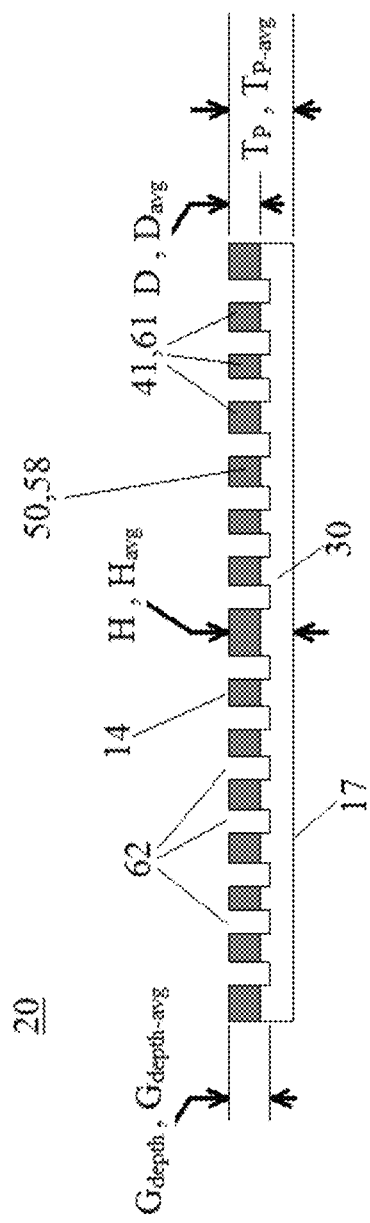
FIG. 15 is a depiction of a cross sectional view of a polishing layer of the present invention taken along line AA-AA in FIG. 14.

Preferably, the second non-fugitive polymeric phase (50) in the polishing layer (20) of the chemical mechanical polishing pad (10) of the present invention is selected from a second continuous non-fugitive polymeric phase (52) (see, e.g., FIGS. 7 and 11) and a second discontinuous non-fugitive polymeric phase (58) (see, e.g., FIGS. 3 and 15).

Preferably, the second non-fugitive polymeric phase (50) in the polishing layer (20) of the chemical mechanical polishing pad (10) of the present invention is formed by a combination of a poly side (P) liquid component and an iso side (I) liquid component.

Preferably, the poly side (P) liquid component comprises at least one of a (P) side polyol, a (P) side polyamine and a (P) side alcohol amine.

Preferably, the (P) side polyol is selected from the group consisting of diols, polyols, polyol diols, copolymers thereof and mixtures thereof. More preferably, the (P) side polyol is selected from the group consisting of polyether polyols (e.g., poly(oxytetramethylene)glycol, poly(oxypropylene)glycol and mixtures thereof); polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Still more preferably, the (P) side polyol is selected from the group consisting of polytetramethylene ether glycol (PTMEG); ester based polyols (such as ethylene adipates, butylene adipates); polypropylene ether glycols (PPG); polycaprolactone polyols; copolymers thereof; and, mixtures thereof.

Preferably, the poly side (P) liquid component used contains a (P) side polyol; wherein the (P) side polyol includes a high molecular weight polyol having a number average molecular weight, $M_N$, of 2,500 to 100,000. More preferably, the high molecular weight polyol used has a number average molecular weight, $M_N$, of 5,000 to 50,000 (still more preferably 7,500 to 25,000; most preferably 10,000 to 12,000).

Preferably, the poly side (P) liquid component used contains a (P) side polyol; wherein the (P) side polyol includes a high molecular weight polyol having an average of three to ten hydroxyl groups per molecule. More preferably, the high molecular weight polyol used has an average of four to eight (still more preferably five to seven; most preferably six) hydroxyl groups per molecule.

Examples of commercially available high molecular weight polyols include Specflex® polyols, Voranol® polyols and Voralux® polyols (available from The Dow Chemical Company); Multranol® Specialty Polyols and Ultracel® Flexible Polyols (available from Bayer MaterialScience LLC); and Pluracol® Polyols (available from BASF). A number of preferred high molecular weight polyols are listed in TABLE 1.

TABLE 1

| High molecular weight polyol | Number of OH groups per molecule | $M_N$ | Hydroxyl Number (mg KOH/g) |
|---|---|---|---|
| Multranol ® 3901 Polyol | 3.0 | 6,000 | 28 |
| Pluracol ® 1385 Polyol | 3.0 | 3,200 | 50 |
| Pluracol ® 380 Polyol | 3.0 | 6,500 | 25 |
| Pluracol ® 1123 Polyol | 3.0 | 7,000 | 24 |
| ULTRACEL ® 3000 Polyol | 4.0 | 7,500 | 30 |
| SPECFLEX ® NC630 Polyol | 4.2 | 7,602 | 31 |
| SPECFLEX ® NC632 Polyol | 4.7 | 8,225 | 32 |
| VORALUX ® HF 505 Polyol | 6.0 | 11,400 | 30 |
| MULTRANOL ® 9185 Polyol | 6.0 | 3,366 | 100 |
| VORANOL ® 4053 Polyol | 6.9 | 12,420 | 31 |

Preferably, the (P) side polyamine is selected from the group consisting of diamines and other multifunctional amines. More preferably, the (P) side polyamine is selected from the group consisting of aromatic diamines and other multifunctional aromatic amines; such as, for example, 4,4'-methylene-bis-o-chloroaniline (MbOCA); 4,4'-methylene-bis-(3-chloro-2,6-diethylaniline) (MCDEA); dimethylthiotoluenediamine; trimethyleneglycol di-p-aminobenzoate; polytetramethyleneoxide di-p-aminobenzoate; polytetramethyleneoxide mono-p-aminobenzoate; polypropyleneoxide di-p-aminobenzoate; polypropyleneoxide mono-p-aminobenzoate; 1,2-bis(2-aminophenylthio)ethane; 4,4'-methylene-bis-aniline; diethyltoluenediamine; 5-tert-butyl-2,4-toluendiamine; 3-tert-butyl-2,6-toluenediamine; 5-tert-amyl-2,4-toluenediamine; and 3-tert-amyl-2,6-toluenediamine and chlorotoluenediamine.

Preferably, the (P) side alcohol amine is selected from the group consisting amine initiated polyols. More preferably, the (P) side alcohol amine is selected from the group consisting amine initiated polyols containing one to four (still more preferably, two to four; most preferably, two) nitrogen atoms per molecule. Preferably, the (P) side alcohol amine is selected from the group consisting amine initiated polyols that have an average of at least three hydroxyl groups per molecule. More preferably, the (P) side alcohol amine is selected from the group consisting of amine initiated polyols that have an average of three to six (still more preferably, three to five; most preferably, four) hydroxyl groups per molecule. Particularly preferred amine initiated polyols a number average molecular weight, $M_N$, of ≤700 (preferably, of 150 to 650; more preferably, of 200 to 500; most preferably 250 to 300) and have a hydroxyl number (as determined by ASTM Test Method D4274-11) of 350 to 1,200 mg KOH/g. More preferably, the amine initiated polyol used has a hydroxyl number of 400 to 1,000 mg KOH/g (most preferably 600 to 850 mg KOH/g). Examples of commercially available amine initiated polyols include the Voranol® family of amine initiated polyols (available from The Dow Chemical Company); the Quadrol® Specialty Polyols (N,N,N',N'-tetrakis(2-hydroxypropyl ethylene diamine)) (available from BASF); Pluracol® amine based polyols (available from BASF); Multranol® amine based polyols (available from Bayer MaterialScience LLC); tri-isopropanolamine (TIPA) (available from The Dow Chemical Company); and, triethanolamine (TEA) (available from Mallinckrodt Baker Inc.). A number of preferred amine initiated polyols are listed in TABLE 2.

TABLE 2

| Amine initiated polyol | Number of OH groups per molecule | $M_N$ | Hydroxyl Number (mg KOH/g) |
|---|---|---|---|
| Triethanolamine | 3 | 149 | 1130 |
| Triisopropanolamine | 3 | 192 | 877 |
| MULTRANOL ® 9138 Polyol | 3 | 240 | 700 |
| MULTRANOL ® 9170 Polyol | 3 | 481 | 350 |
| VORANOL ® 391 Polyol | 4 | 568 | 391 |
| VORANOL ® 640 Polyol | 4 | 352 | 638 |
| VORANOL ® 800 Polyol | 4 | 280 | 801 |
| QUADROL ® Polyol | 4 | 292 | 770 |
| MULTRANOL ® 4050 Polyol | 4 | 356 | 630 |
| MULTRANOL ® 4063 Polyol | 4 | 488 | 460 |
| MULTRANOL ® 8114 Polyol | 4 | 568 | 395 |
| MULTRANOL ® 8120 Polyol | 4 | 623 | 360 |
| MULTRANOL ® 9181 Polyol | 4 | 291 | 770 |
| VORANOL ® 202 Polyol | 5 | 590 | 475 |

Preferably, the iso side (I) liquid component comprises at least one (I) side polyfunctional isocyanate. Preferably, the at least one (I) side polyfunctional isocyanate contains two reactive isocyanate groups (i.e., NCO).

Preferably, the at least one (I) side polyfunctional isocyanate is selected from the group consisting of an (I) side aliphatic polyfunctional isocyanate, an (I) side aromatic polyfunctional isocyanate and a mixture thereof. More preferably, the (I) side polyfunctional isocyanate is an (I) side diisocyanate selected from the group consisting of 2,4-toluene diisocyanate; 2,6-toluene diisocyanate; 4,4'-diphenylmethane diisocyanate; naphthalene-1,5-diisocyanate; tolidine diisocyanate; para-phenylene diisocyanate; xylylene diisocyanate; isophorone diisocyanate; hexamethylene diisocyanate; 4,4'-dicyclohexylmethane diisocyanate; cyclohexanediisocyanate; and, mixtures thereof. Still more preferably, the at least one (I) side polyfunctional isocyanate is an (I) side isocyanate terminated urethane prepolymer formed by reacting an (I) side diisocyanate with an (I) side prepolymer polyol.

Preferably, the at least one (I) side polyfunctional isocyanate is an (I) side isocyanate-terminated urethane prepolymer; wherein the (I) side isocyanate-terminated urethane prepolymer has 2 to 12 wt % unreacted isocyanate (NCO) groups. More preferably, the (I) side isocyanate-terminated urethane prepolymer used in the method of the present invention has 2 to 10 wt % (still more preferably 4 to 8 wt %; most preferably 5 to 7 wt %) unreacted isocyanate (NCO) groups.

Preferably, the (I) side isocyanate terminated urethane prepolymer used is reacted from an (I) side diisocyanate and an (I) side prepolymer polyol; wherein the (I) side prepolymer polyol is selected from the group consisting of diols, polyols, polyol diols, copolymers thereof and mixtures thereof. More preferably, the (I) side prepolymer polyol is selected from the group consisting of polyether polyols (e.g., poly(oxytetramethylene)glycol, poly(oxypropylene)glycol and mixtures thereof); polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Still more preferably, the (I) side prepolymer polyol is selected from the group consisting of polytetramethylene ether glycol (PTMEG); ester based polyols (such as ethylene adipates, butylene adipates); polypropylene ether glycols (PPG); polycaprolactone polyols; copolymers thereof; and, mixtures thereof. Most preferably, the (I) side prepolymer polyol is selected from the group consisting of PTMEG and PPG.

Preferably, when the (I) side prepolymer polyol is PTMEG, the (I) side isocyanate terminated urethane prepolymer has an unreacted isocyanate (NCO) concentration of 2 to 10 wt % (more preferably of 4 to 8 wt %; most preferably 6 to 7 wt %). Examples of commercially available PTMEG based isocyanate terminated urethane prepolymers include Imuthane® prepolymers (available from COIM USA, Inc., such as, PET-80A, PET-85A, PET-90A, PET-93A, PET-95A, PET-60D, PET-70D, PET-75D); Adiprene® prepolymers (available from Chemtura, such as, LF 800A, LF 900A, LF 910A, LF 930A, LF 931A, LF 939A, LF 950A, LF 952A, LF 600D, LF 601D, LF 650D, LF 667, LF 700D, LF750D, LF751D, LF752D, LF753D and L325); Andur® prepolymers (available from Anderson Development Company, such as, 70APLF, 80APLF, 85APLF, 90APLF, 95APLF, 60DPLF, 70APLF, 75APLF).

Preferably, when the (I) side prepolymer polyol is PPG, the (I) side isocyanate terminated urethane prepolymer has an unreacted isocyanate (NCO) concentration of 3 to 9 wt % (more preferably 4 to 8 wt %, most preferably 5 to 6 wt %). Examples of commercially available PPG based isocyanate terminated urethane prepolymers include Imuthane® prepolymers (available from COIM USA, Inc., such as, PPT-80A, PPT-90A, PPT-95A, PPT-65D, PPT-75D); Adiprene® prepolymers (available from Chemtura, such as, LFG 963A, LFG 964A, LFG 740D); and, Andur® prepolymers (available from Anderson Development Company, such as, 8000APLF, 9500APLF, 6500DPLF, 7501DPLF).

Preferably, the (I) side isocyanate terminated urethane prepolymer used in the method of the present invention is a low free isocyanate terminated urethane prepolymer having less than 0.1 wt % free toluene diisocyanate (TDI) monomer content.

Preferably, at least one of the poly side (P) liquid component and the iso side (I) liquid component can optionally contain additional liquid materials. For example, at least one of the poly side (P) liquid component and the iso side (I) liquid component can contain liquid materials selected from the group consisting of foaming agents (e.g., carbamate foaming agents such as Specflex™ NR 556 $CO_2$/aliphatic amine adduct available from The Dow Chemical Company); catalyst (e.g., tertiary amine catalysts such as Dabco® 33LV catalyst available from Air Products, Inc.; and tin catalyst such as Fomrez® tin catalyst from Momentive); and surfactants (e.g., Tegostab® silicon surfactant from Evonik). Preferably, the poly side (P) liquid component contains an additional liquid material. More preferably, the poly side (P) liquid component contains an additional liquid material; wherein the additional liquid material is at least one of a catalyst and a surfactant. Most preferably, the poly side (P) liquid component contains a catalyst and a surfactant.

Preferably, the second non-fugitive polymeric phase (50) in the polishing layer (20) of the chemical mechanical polishing pad (10) has a Shore D hardness of 10 to 70 as measured according to ASTM D2240. More preferably, the second non-fugitive polymeric phase (50) in the polishing layer (20) of the chemical mechanical polishing pad (10) has a Shore D hardness of 20 to 60 (still more preferably 25 to 55; most preferably 40 to 50) as measured according to ASTM D2240.

Preferably, the second non-fugitive polymeric phase (50) in the polishing layer (20) of the chemical mechanical polishing pad (10) of the present invention has an open cell porosity of ≥10 vol %. More preferably, the second non-fugitive polymeric phase (50) in the polishing layer (20) of the chemical mechanical polishing pad (10) of the present invention has an open cell porosity of 25 to 75 vol % (more preferably, 30 to 60 vol %; most preferably, 45 to 55 vol %).

Preferably, the first continuous non-fugitive polymeric phase (30) in the chemical mechanical polishing pad (10) of the present invention has a plurality of periodic recesses (40) having a depth, D, measured normal to the polishing surface (14) from the polishing surface (14) toward the base surface. Preferably, the plurality of periodic recesses (40) have an average depth, $D_{avg}$; wherein $D_{avg} \leq T_{P-avg}$. More preferably, the plurality of periodic recesses (40) have an average depth, $D_{avg}$; wherein $D_{avg} \leq 0.5 \ast T_{P-avg}$ (more preferably, $D_{avg} \leq 0.4 \ast T_{P-avg}$; most preferably, $D_{avg} \leq 0.375 \ast T_{P-avg}$). Preferably, the plurality of periodic recesses are dissected by at least one groove. (See FIGS. 3, 7, 11 and 15).

Preferably, the plurality of periodic recesses (40) are selected from curved recesses, linear recesses and combinations thereof (See FIGS. 2, 5-6, 8-9, 10, 13-14 and 14).

Preferably, the first continuous non-fugitive polymeric phase (30) in the chemical mechanical polishing pad (10) of the present invention has a plurality of periodic recesses (40), wherein the plurality of periodic recesses is a group of at least two concentric recesses (45). (See, e.g., FIGS. 2, 5-6 and 9). Preferably, the at least two concentric recesses (45) have an average recess depth, $D_{avg}$, of ≥15 mils (preferably, 15 to 40 mils; more preferably, 25 to 35 mils; most preferably, 30 mils), a width of ≥5 mils (preferably, 5 to 150 mils; more preferably, 10 to 100 mils; most preferably, 15 to 50 mils) and a pitch of ≥10 mils (preferably, 25 to 150 mils; more preferably, 50 to 100 mils; most preferably, 60 to 80 mils). Preferably, the at least two concentric recesses (45) have a width and a pitch, wherein the width and pitch are equal.

Preferably, the plurality of periodic recesses (40) can be selected from the group consisting of a plurality of disconnected periodic recesses (41) and a plurality of interconnected periodic recesses (42). Preferably, when the plurality of periodic recesses (40) is a plurality of disconnected periodic recesses (41), the second non-fugitive polymeric phase (50) is a second discontinuous non-fugitive polymeric phase (58). (See, e.g., FIGS. 2-3 and 5). Preferably, when the plurality of periodic recesses (40) is a plurality of interconnected periodic recesses (42), the second non-fugitive polymeric phase (50) is a second continuous non-fugitive polymeric phase (52). (See, e.g., FIGS. 6-7).

Preferably, the first continuous non-fugitive polymeric phase (30) in the chemical mechanical polishing pad (10) of the present invention has a plurality of disconnected periodic recesses (41), wherein the plurality of disconnected periodic recesses (41) is a group of at least two concentric recesses (45). (See, e.g., FIG. 2).

Preferably, the first continuous non-fugitive polymeric phase (30) in the chemical mechanical polishing pad (10) of the present invention has a plurality of disconnected periodic recesses (41), wherein the plurality of periodic recesses (41) is a group of at least two cross-hatched recesses (61); wherein the plurality of periodic recesses (41) are dissected by at least one groove (62). (See, e.g., FIGS. 14-15).

Preferably, the first continuous non-fugitive polymeric phase (30) in the chemical mechanical polishing pad (10) of the present invention has a plurality of interconnected periodic recesses (42), wherein the plurality of interconnected periodic recesses is a group of at least two concentric recesses (45) with at least one interconnection (48) interconnecting the at least two concentric recesses (45). (See, e.g., FIG. 6-7).

Preferably, the continuous non-fugitive polymeric phase (30) in the chemical mechanical polishing pad (10) of the present invention has a plurality of interconnected periodic recesses (40), wherein the plurality of periodic recesses is a group of at least two interconnected cross-hatched recesses (60). (See, e.g., FIG. 8).

Preferably, the second non-fugitive polymeric phase (50) occupying the plurality of periodic recesses (40) in the chemical mechanical polishing pad (10) of the present invention has a height, H, measured normal to the polishing surface (14) from the base surface (17) of polishing layer (20) toward the polishing surface (14). Preferably, the second non-fugitive polymeric phase (50) occupying the plurality of periodic recesses (40) has an average height, $H_{avg}$, measured normal to the polishing surface (14) from the base surface (17) of polishing layer (20) toward the polishing surface (14); wherein the absolute value of the difference, ΔS, between the average thickness, $T_{P-avg}$, of the polishing layer (20) and the average height, $H_{avg}$, of the second non-fugitive polymeric phase (50) is ≤0.5 μm. More preferably, the second non-fugitive polymeric phase (50) occupying the plurality of periodic recesses (40) has an average height, $H_{avg}$, measured normal to the polishing surface (14) from the base surface (17) of polishing layer (20) toward the polishing surface (14); wherein the absolute value of the difference, ΔS, between the average thickness, $T_{P-avg}$, of the polishing layer (20) and the average height, $H_{avg}$, of the second non-fugitive polymeric phase (50) is ≤0.2 μm. Still more preferably, the second non-fugitive polymeric phase (50) occupying the plurality of periodic recesses (40) has an average height, $H_{avg}$, measured normal to the polishing surface (14) from the base surface (17) of polishing layer (20) toward the polishing surface (14); wherein the absolute value of the difference, ΔS, between the average thickness, $T_{P-avg}$, of the polishing layer (20) and the average height, $H_{avg}$, of the second non-fugitive polymeric phase (50) is ≤0.1 μm. Most preferably, the second non-fugitive polymeric phase (50) occupying the plurality of periodic recesses (40) has an average height, $H_{avg}$, measured normal to the polishing surface (14) from the base surface (17) of polishing layer (20) toward the polishing surface (14); wherein the absolute value of the difference, ΔS, between the average thickness, $T_{P-avg}$, of the polishing layer (20) and the average height, $H_{avg}$, of the second non-fugitive polymeric phase (50) is ≤0.05 μm. (See FIGS. 3, 7, 11 and 15).

Preferably, the second non-fugitive polymeric phase (50) occupies the plurality of periodic recesses (40) in the first continuous non-fugitive polymeric phase (30), wherein there are chemical bonds between the first continuous non-fugitive polymeric phase (30) and the second non-fugitive polymeric phase (50). More preferably, the second non-fugitive polymeric phase (50) occupies the plurality of periodic recesses (40) in the first continuous non-fugitive polymeric phase (30), wherein there are covalent bonds between the first continuous non-fugitive polymeric phase (30) and the second non-fugitive polymeric phase (50) such that the phases cannot be separated unless the covalent bonds between the phases are broken.

One of ordinary skill in the art will understand to select a polishing layer (20) having a thickness, $T_P$, suitable for use in a chemical mechanical polishing pad (10) for a given polishing operation. Preferably, the polishing layer (20) exhibits an average thickness, $T_{P-avg}$, along an axis (12) perpendicular to a plane (28) of the polishing surface (14).

More preferably, the average thickness, $T_{P-avg}$, is 20 to 150 mils (more preferably, 30 to 125 mils; most preferably, 40 to 120 mils). (See FIGS. 1, 3, 7, 11 and 15).

Preferably, the polishing surface (14) of the polishing layer (20) of the chemical mechanical polishing pad (10) of the present invention is adapted for polishing a substrate selected from at least one of a magnetic substrate, an optical substrate and a semiconductor substrate (more preferably, a semiconductor substrate; most preferably, a semiconductor wafer). Preferably, the polishing surface (14) of the polishing layer (20) has at least one of macrotexture and microtexture to facilitate polishing the substrate. Preferably, the polishing surface (14) has macrotexture, wherein the macrotexture is designed to do at least one of (i) alleviate at least one of hydroplaning; (ii) influence polishing medium flow; (iii) modify the stiffness of the polishing layer; (iv) reduce edge effects; and, (v) facilitate the transfer of polishing debris away from the area between the polishing surface (14) and the substrate being polished.

Preferably, the polishing layer (20) of the chemical mechanical polishing pad (10) of the present invention, further comprises: at least one of at least one perforation (not shown) and at least one groove (62). More preferably, the polishing layer (20) of the chemical mechanical polishing pad (10) of the present invention has at least one groove (62) formed in the polishing layer (20) opening at the polishing surface (14) and having a groove depth, $G_{depth}$, from the polishing surface (14) measured normal to the polishing surface (14) from the polishing surface (14) toward the base surface (17). Preferably, the at least one groove (62) is arranged on the polishing surface (14) such that upon rotation of the chemical mechanical polishing pad (10) during polishing, at least one groove (62) sweeps over the substrate. Preferably, the at least one groove (62) is selected from curved grooves, linear grooves and combinations thereof. Preferably, the at least one groove (62) has a groove depth, $G_{depth}$, of ≥10 mils (preferably, 10 to 150 mils). Preferably, the at least one groove (62) has a groove depth, $G_{depth}$, ≤the average depth of the plurality of periodic recesses, $D_{avg}$. Preferably, the at least one groove (62) has a groove depth, $G_{depth}$, >the average depth of the plurality of periodic recesses, $D_{avg}$. Preferably, the at least one groove (62) forms a groove pattern that comprises at least two grooves (62) having a combination of a groove depth, $G_{depth}$, selected from ≥10 mils, ≥15 mils and 15 to 150 mils; a width selected from ≥10 mils and 10 to 100 mils; and a pitch selected from ≥30 mils, ≥50 mils, 50 to 200 mils, 70 to 200 mils, and 90 to 200 mils. Preferably, the at least one groove (62) is selected from (a) at least two concentric grooves; (b) at least one spiral groove; (c) a cross hatch groove pattern; and (d) a combination thereof. (See FIGS. 11 and 15).

Preferably, the polishing layer (20) of the chemical mechanical polishing pad (10) of the present invention has <0.2 wt % abrasive particles incorporated therein. More preferably, the polishing layer (20) of the chemical mechanical polishing pad (10) has <1 ppm abrasive particles incorporated therein.

Preferably, the chemical mechanical polishing pad (10) of the present invention further comprises a subpad (25). Preferably, the subpad (25) is made of a material selected from the group consisting of an open cell foam, a closed cell foam, a woven material, a nonwoven material (e.g., felted, spun bonded, and needle punched materials), and combinations thereof. One of ordinary skill in the art will know to select an appropriate material of construction and thickness, $T_s$, for use as a subpad (25). Preferably, the subpad (25) has an average subpad thickness, $T_{S-avg}$, of ≥15 mils (more preferably, 30 to 100 mils; most preferably 30 to 75 mils). (See FIGS. 3 and 7).

One of ordinary skill in the art will know how to select an appropriate stack adhesive (23) for use in the chemical mechanical polishing pad (10). Preferably, the stack adhesive (23) is a hot melt adhesive. More preferably, the stack adhesive (23) is a reactive hot melt adhesive. Still more preferably, the hot melt adhesive (23) is a cured reactive hot melt adhesive that exhibits a melting temperature in its uncured state of 50 to 150° C., preferably of 115 to 135° C. and exhibits a pot life of ≤90 minutes after melting. Most preferably, the reactive hot melt adhesive (23) in its uncured state comprises a polyurethane resin (e.g., Mor-Melt™ R5003 available from The Dow Chemical Company).

Preferably, the chemical mechanical polishing pad (10) of the present invention is adapted to be interfaced with a platen of a polishing machine. Preferably, the chemical mechanical polishing pad (10) is adapted to be affixed to the platen of a polishing machine. More preferably, the chemical mechanical polishing pad (10) can be affixed to the platen using at least one of a pressure sensitive adhesive and vacuum.

Preferably, the chemical mechanical polishing pad (10) includes a pressure sensitive platen adhesive (70) applied to the bottom surface (27) of the subpad (25). One of ordinary skill in the art will know how to select an appropriate pressure sensitive adhesive for use as the pressure sensitive platen adhesive (70). Preferably, the chemical mechanical polishing pad (10) will also include a release liner (75) applied over the pressure sensitive platen adhesive (70), wherein the pressure sensitive platen adhesive (70) is interposed between the bottom surface (27) of the rigid layer (25) and the release liner (75). (See FIGS. 3 and 7).

An important step in substrate polishing operations is determining an endpoint to the process. One popular in situ method for endpoint detection involves providing a polishing pad with a window, which is transparent to select wavelengths of light. During polishing, a light beam is directed through the window to the wafer surface, where it reflects and passes back through the window to a detector (e.g., a spectrophotometer). Based on the return signal, properties of the substrate surface (e.g., the thickness of films thereon) can be determined for endpoint detection. To facilitate such light based endpoint methods, the chemical mechanical polishing pad (10) of the present invention, optionally further comprises an endpoint detection window (65). Preferably, the endpoint detection window (65) is selected from an integral window incorporated into the polishing layer (20); and, a plug in place endpoint detection window block incorporated into the chemical mechanical polishing pad (10). One of ordinary skill in the art will know to select an appropriate material of construction for the endpoint detection window for use in the intended polishing process. (See FIG. 12).

Preferably, the method of polishing a substrate of the present invention, comprises: providing a substrate selected from at least one of a magnetic substrate, an optical substrate and a semiconductor substrate (preferably a semiconductor substrate; more preferably, a semiconductor substrate, wherein the semiconductor substrate is a semiconductor wafer); providing a chemical mechanical polishing pad according to the present invention; creating dynamic contact between a polishing surface of the polishing layer and the substrate to polish a surface of the substrate; and, conditioning of the polishing surface with an abrasive conditioner. More preferably, in the method of polishing a substrate of the present invention, the first continuous non-fugitive polymeric phase (30) and the second non-fugitive polymeric phase (50) wear evenly from the polishing surface (14) of the polishing layer (20). Most preferably, in the method of polishing a substrate of the present invention, the first continuous non-fugitive polymeric phase (30) and the second non-fugitive polymeric phase (50) wear at substantially the same rate from the polishing surface (14) of the polishing layer (20) such that the absolute value of the difference, ΔS, between the average thickness, $T_{P\text{-}avg}$, of the polishing layer (20) and the average height, $H_{avg}$, of the second non-fugitive polymeric phase (50) remains ≤0.5 µm (preferably, ≤0.2 µm; more preferably, ≤0.1 µm; most preferably, ≤0.05 µm) throughout the useful lifetime of the chemical mechanical polishing pad (10).

Some embodiments of the present invention will now be described in detail in the following Examples.

EXAMPLES 1-3

Chemical Mechanical Polishing Pad

Commercial polyurethane polishing pads were used as the first continuous non-fugitive polymeric phase in the chemical mechanical polishing pads prepared according to each of Examples 1-3. Particularly, in Example 1, a commercial IC1000™ polyurethane polishing pad with a plurality of concentric circular periodic recesses having an average recess depth, $D_{avg}$, of 30 mils, a width of 60 mils and a pitch of 120 mils was provided as the first continuous non-fugitive polymeric phase. In Example 2, a commercial VP5000™ polyurethane polishing pad with a plurality of concentric circular recesses having an average recess depth, $D_{avg}$, of 30 mils, a width of 35 mils and a pitch of 70 mils was provided as the first continuous non-fugitive polymeric phase. In Example 3, a commercial VP5000™ polyurethane polishing pad with a plurality of concentric circular recesses having an average recess depth, $D_{avg}$, of 30 mils, a width of 60 mils and a pitch of 120 mils was provided as the first continuous non-fugitive polymeric phase.

A poly side (P) liquid component was provided, containing: 77.62 wt % high molecular weight polyether polyol (Voralux® HF 505 polyol available from The Dow Chemical Company); 21.0 wt % monoethylene glycol; 1.23 wt % of a silicone surfactant (Tegostab® B8418 surfactant available from Evonik); 0.05 wt % of a tin catalyst (Fomrez® UL-28 available from Momentive); and, 0.10 wt % of a tertiary amine catalyst (Dabco® 33LV catalyst available from Air Products, Inc.). An additional liquid material (Specflex™ NR 556 $CO_2$/aliphatic amine adduct available from The Dow Chemical Company) was added to the poly side (P) liquid component at 4 parts per 100 parts poly side (P) liquid component by weight. An iso side (I) liquid component was provided, containing: 100 wt % of a modified diphenylmethane diisocyanate (Isonate™ 181 MDI prepolymer available from The Dow Chemical Company.) A pressurized gas (dry air) was provided.

A second non-fugitive polymeric phase was then provided in the plurality of concentric circular recesses of each of the first continuous non-fugitive polymeric phase materials using an axial mixing device (MicroLine 45 CSM axial mixing device available from Hennecke GmbH) having a (P) side liquid feed port, an (I) side liquid feed port and four tangential pressurized gas feed ports. The poly side (P) liquid component and the iso side (I) liquid component were fed to the axial mixing device through their respective feed ports with a (P) side charge pressure of 12,500 kPa, an (I) side charge pressure of 17,200 kPa and at a weight ratio of (I)/(P) of 1.564 (giving a stoichiometric ratio of reactive hydrogen groups to NCO groups of 0.95). The pressurized gas was fed through the tangential pressurized gas feed ports with a supply pressure of 830 kPa to give a combined liquid component to gas mass flow rate ratio through the axial mixing device of 3.8 to 1 to form a combination. The combination was then discharged from the axial mixing device toward each of the noted first continuous non-fugitive polymeric phases at a velocity of 254 m/sec to fill the plurality of recesses and forming composite structures. The composite structures were allowed to cure for 16 hours at 100° C. The composite structures were then machined flat on a lathe to derive the chemical mechanical polishing pads of Examples 1-3. The polishing surfaces of each of the chemical mechanical polishing pads of Examples 1-3, were then grooved to provide an X-Y groove pattern having a 70 mil groove width, 32 mil groove depth, and a 580 mil pitch.

Open Cell Porosity

The open cell porosity of commercial IC1000™ polishing pad polishing layers and VP5000™ polishing pad polishing layers is reported to be <3 vol %. The open cell porosity of the second non-fugitive polymeric phase formed in the chemical mechanical polishing pads in each of Examples 1-3 was >10 vol %.

Comparative Examples PC1-PC2 and Examples P1-P3

Chemical Mechanical Polishing Removal Rate Experiments

Silicon dioxide removal rate polishing tests were performed using the chemical mechanical polishing pads prepared according to each of Examples 1-3 and compared with those obtained in Comparative Examples PC1-PC2 using an IC1000™ polyurethane polishing pad and a VP5000™ (both commercially available from Rohm and Haas Electronic Materials CMP Inc.) and each having the same X-Y groove pattern noted in the Examples. Specifically, the silicon dioxide removal rate for each of the polishing pads is provided in TABLE 3. The polishing removal rate experiments were performed on 200 mm blanket S15KTEN TEOS sheet wafers from Novellus Systems, Inc. An Applied Materials 200 mm Mirra® polisher was used. All polishing experiments were performed with a down force of 8.3 kPa (1.2 psi), a slurry flow rate of 200 ml/min (ACuPlane™ 5105 slurry available from Rohm and Haas Electronic Materials CMP Inc.), a table rotation speed of 93 rpm and a carrier rotation speed of 87 rpm. A Saesol 8031C diamond pad conditioner (commercially available from Saesol Diamond Ind. Co., Ltd.) was used to condition the polishing pads. The polishing pads were each broken in with the conditioner using a down force of 31.1 N for 10 minutes. The polishing pads were further conditioned 50% in situ during polishing at 10 sweeps/min from 1.7 to 9.2 in from the center of the polishing pad with a down force of 31.1 N. The removal rates were determined by measuring the film thickness before and after polishing using a KLA-Tencor FX200 metrology tool using a 49 point spiral scan with a 3 mm edge exclusion. Each of the removal rate experiments were performed three times. The average removal rate for the triplicate removal rate experiments for each of the polishing pads is provided in TABLE 3.

TABLE 3

| Ex # | Chemical mechanical polishing pad | TEOS removal rate (Å/min) |
|---|---|---|
| PC1 | IC1000 ™ pad | 321 |
| PC2 | VP5000 ™ pad | 199 |
| P1 | Ex. 1 (1521A) | 426 |
| P2 | Ex. 2 (1521B) | 355 |
| P3 | Ex. 3 (1521C) | 304 |

We claim:

1. A chemical mechanical polishing pad, comprising:
a polishing layer having a polishing surface, a base surface and an average thickness, $T_{P\text{-}avg}$, measured normal to the polishing surface from the base surface to the polishing surface;
wherein the polishing layer comprises a first continuous non-fugitive polymeric phase and a second non-fugitive polymeric phase;
wherein the first continuous non-fugitive polymeric phase has a plurality of periodic recesses having an average recess depth, $D_{avg}$, from the polishing surface measured normal to the polishing surface from the polishing surface toward the base surface;
wherein the average recess depth, $D_{avg}$, is less than the average thickness, $T_{p\text{-}avg}$;
wherein the plurality of periodic recesses are occupied with the second non-fugitive polymeric phase;
wherein the first continuous non-fugitive polymeric phase is a reaction product of a first continuous phase isocyanate-terminated urethane prepolymer having 8 to 12wt % unreacted NCO groups and a first continuous phase curative;
wherein the second non-fugitive polymeric phase is selected from a second continuous non-fugitive polymeric phase and a second discontinuous non-fugitive polymeric phase;
wherein the second non-fugitive polymeric phase is formed by combining a poly side (P) liquid component and an iso side (I) liquid component;
wherein the poly side (P) liquid component comprises at least one of a (P) side polyol, a (P) side polyamine and a (P) side alcohol amine;
wherein the iso side (I) liquid component, comprising at least one (I) side polyfunctional isocyanate;
wherein the first continuous non-fugitive polymeric phase has an open cell porosity of ≤6 vol %;
wherein the second non-fugitive polymeric phase contains an open cell porosity of ≥10 vol %; and,
wherein the polishing surface is adapted for polishing a substrate so that the first continuous non-fugitive polymeric phase and the second non-fugitive polymeric phase wear evenly from the polishing surface.

2. The chemical mechanical polishing pad of claim 1, wherein the second non-fugitive polymeric phase occupying the plurality of periodic recesses has an average height, $H_{avg}$, measured normal to the polishing surface from the base surface of the polishing layer toward the polishing surface; and, wherein an absolute value of a difference, $\Delta S$, between the average thickness, $T_{P\text{-}avg}$, and the average height, $H_{avg}$, is ≤0.5 μm.

3. The chemical mechanical polishing pad of claim 2; wherein the first continuous non-fugitive polymeric phase contains a plurality of hollow core polymeric materials; wherein the plurality of hollow core polymeric materials is incorporated in the first continuous non-fugitive polymeric phase at 1 to 58 vol %.

4. The chemical mechanical polishing pad of claim 2, wherein the plurality of periodic recesses is a group of at least two concentric recesses and wherein the average recess depth, $D_{avg}$, is ≥15 mils, a width of ≥5 mils and a pitch of ≥10 mils.

5. The chemical mechanical polishing pad of claim 2, wherein the plurality of periodic recesses is a group of at least two cross-hatched recesses.

6. The chemical mechanical polishing pad of claim 2, further comprising:
at least one groove formed in the polishing layer at the polishing surface; wherein the at least one groove has a groove depth, $G_{depth}$, from the polishing surface measured in a direction normal to the polishing surface from the polishing surface toward the base surface.

7. The chemical mechanical polishing pad of claim 6, wherein the at least one groove is a group of at least two concentric grooves.

8. The chemical mechanical polishing pad of claim 6, wherein the at least one groove is at least one spiral groove.

9. The chemical mechanical polishing pad of claim 6, wherein the at least one groove is provided in a cross hatch pattern.

10. The chemical mechanical polishing pad as claimed in claim 1, wherein there are chemical bonds between the first continuous non-fugitive polymeric phase and the second non-fugitive polymeric phase.

11. A method of polishing a substrate, comprising:
providing a substrate selected from at least one of a magnetic substrate, an optical substrate and a semiconductor substrate;
providing a chemical mechanical polishing pad according to claim 1;
creating dynamic contact between the polishing surface of the polishing layer and the substrate to polish a surface of the substrate; and,
conditioning of the polishing surface with an abrasive conditioner.

* * * * *